United States Patent
Yuan

(10) Patent No.: US 10,634,713 B2
(45) Date of Patent: Apr. 28, 2020

(54) METHOD FOR TESTING SEMICONDUCTOR DIE PAD UNTOUCHED BY PROBE AND RELATED TEST CIRCUIT

(71) Applicant: Piecemakers Technology, Inc., Hsinchu (TW)

(72) Inventor: Der-Min Yuan, New Taipei (TW)

(73) Assignee: Piecemakers Technology, Inc., Hsinchu County (TW)

( * ) Notice: Subject to any disclaimer, the term of this patent is extended or adjusted under 35 U.S.C. 154(b) by 312 days.

(21) Appl. No.: 15/903,015

(22) Filed: Feb. 22, 2018

(65) Prior Publication Data

US 2019/0257879 A1  Aug. 22, 2019

(51) Int. Cl.
 *G01R 31/50* (2020.01)
 *G01R 31/28* (2006.01)

(52) U.S. Cl.
 CPC ..... *G01R 31/2853* (2013.01); *G01R 31/2882* (2013.01); *G01R 31/50* (2020.01)

(58) Field of Classification Search
 CPC ................ G01R 31/2853; G01R 31/50; G01R 31/2882; G01R 31/52; G01R 31/54; G01R 31/55; G01R 31/56; G01R 31/31728; G01R 19/00
 See application file for complete search history.

(56) References Cited

U.S. PATENT DOCUMENTS

| | | | | |
|---|---|---|---|---|
| 4,327,426 A * | 4/1982 | McAdams | .......... | G11C 11/4087 365/203 |
| 4,590,353 A * | 5/1986 | Obara | .......... | B23H 1/022 219/69.13 |
| 5,896,328 A * | 4/1999 | Tanizaki | .......... | G11C 29/84 365/200 |
| 2008/0092258 A1* | 4/2008 | Clarke | .......... | B60L 1/003 307/10.1 |
| 2009/0295401 A1* | 12/2009 | Kamata | .......... | G01R 31/50 324/509 |
| 2014/0009184 A1* | 1/2014 | Chang | .......... | G01R 31/2853 324/757.04 |
| 2014/0340971 A1* | 11/2014 | You | .......... | G11C 29/56 365/189.11 |
| 2016/0347103 A1* | 12/2016 | Okita | .......... | H02J 7/0069 |

FOREIGN PATENT DOCUMENTS

| | | |
|---|---|---|
| JP | 2001-91558 | 4/2001 |
| JP | 2006-300532 | 11/2006 |
| TW | 228936 | 8/1994 |
| TW | 201043979 A1 | 12/2010 |
| TW | 201405143 A | 2/2014 |

* cited by examiner

*Primary Examiner* — Jermele M Hollington
*Assistant Examiner* — Taqi R Nasir
(74) *Attorney, Agent, or Firm* — Winston Hsu

(57) ABSTRACT

A method for testing a semiconductor die is provided. The method includes the following steps: charging a die pad of the semiconductor die to a precharge level; stopping charging the die pad to detect a period of time required for a voltage level of the die pad to change from the precharge level to a reference level, and accordingly generating a detection result; and determining a leakage current of the die pad according to the detection result.

14 Claims, 5 Drawing Sheets

METHOD FOR TESTING SEMICONDUCTOR DIE PAD UNTOUCHED BY PROBE AND RELATED TEST CIRCUIT

BACKGROUND OF THE INVENTION

1. Field of the Invention

The disclosed embodiments of the present invention relate to die testing, and more particularly, to a method for testing a semiconductor die, which is capable of detecting a leakage current of a die pad untouched by a probe, and a related test circuit of a semiconductor die.

2. Description of the Prior Art

In a conventional known-good-die (KGD) test circuit, as many die pads are not probed (i.e. floating) during chip probe test operation in order to reduce test costs, leakage currents flowing through the die pads cannot be estimated, resulting in yield losses. Thus, there is a need for a novel test circuit for a semiconductor die to ensure a high yield rate.

SUMMARY OF THE INVENTION

In accordance with exemplary embodiments of the present invention, a method for testing a semiconductor die, which is capable of detecting a leakage current of a die pad untouched by a probe, and a related test circuit of a semiconductor die are proposed to solve the above-mentioned problems.

According to an embodiment of the present invention, an exemplary method for testing a semiconductor die is disclosed. The exemplary method comprises the following steps: charging a die pad of the semiconductor die to a precharge level; stopping charging the die pad to detect a period of time required for a voltage level of the die pad to change from the precharge level to a reference level, and accordingly generating a detection result; and determining a leakage current of the die pad according to the detection result.

According to an embodiment of the present invention, an exemplary test circuit of a semiconductor die is disclosed. The exemplary test circuit comprises a precharge circuit and a processing circuit. The precharge circuit is coupled to a die pad of the semiconductor die, and is arranged for charging the die pad to a precharge level. The processing circuit is coupled to the die pad, and is arranged for detecting a period of time required for a voltage level of the die pad to change from the precharge level to a reference level when the precharge circuit stops charging the die pad, and accordingly generating a detection result, wherein the processing circuit further determines a leakage current of the die pad according to the detection result.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
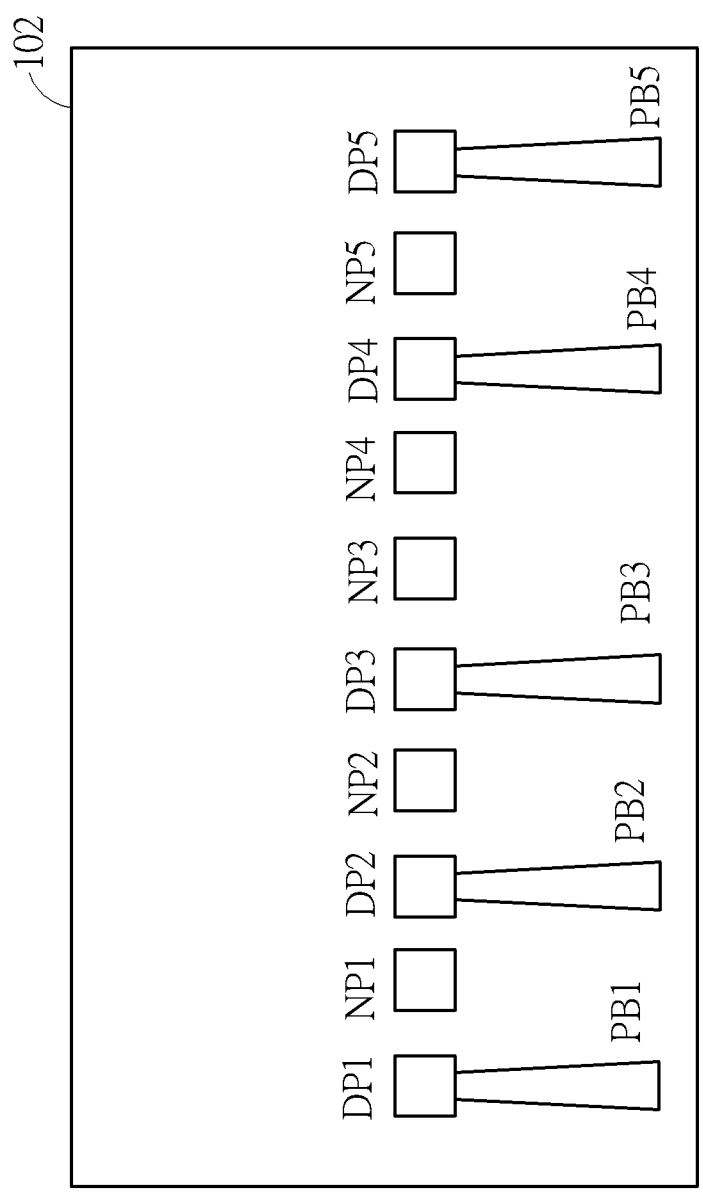
FIG. 1 illustrates an exemplary semiconductor die tested using a plurality of probes of a probe card according to an embodiment of the present invention.

FIG. 1 illustrates an exemplary semiconductor die tested using a plurality of probes of a probe card according to an embodiment of the present invention. In this embodiment, a plurality of die pads DP1-DP5 of the semiconductor die 102 are touched by a plurality of probes PB1-PB5 of a probe card (not shown in FIG. 1) for die testing, while a plurality of die pads NP1-NP5 are not touched by the probe card. Each die pad may be implemented by an input pad or an input-output pad (I/O pad), wherein the input pad may receive a common signal or an address signal, and the I/O pad may receive/transmit a data signal. By detecting a leakage current of a die pad without using a probe to touch the die pad, the proposed test scheme for a semiconductor die may thoroughly detect defects on the semiconductor die and perform KGD test with high accuracy.

Figure 2:
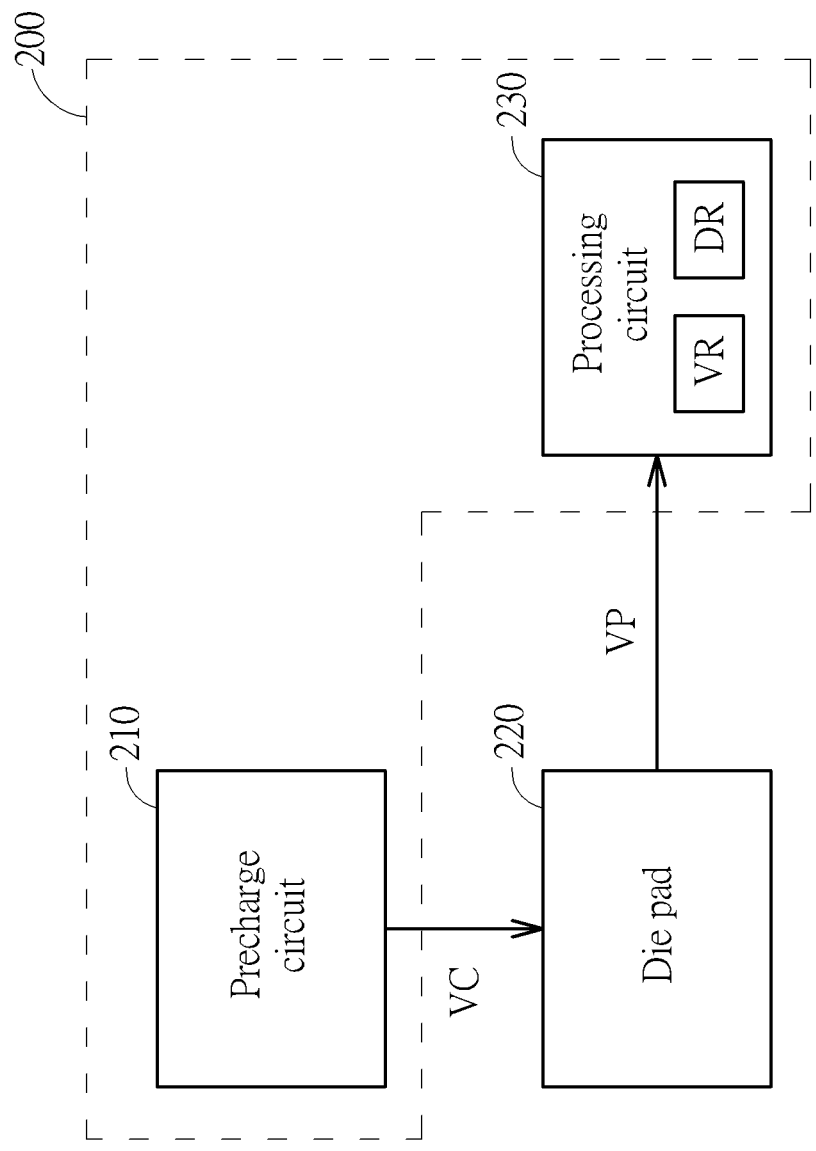
FIG. 2 is a diagram illustrating an exemplary test circuit of a semiconductor die according to an embodiment of the present invention.

Please refer to FIG. 2 in conjunction with FIG. 1. FIG. 2 is a diagram illustrating an exemplary test circuit of a semiconductor die according to an embodiment of the present invention. The test circuit 200 may be used for testing die pads untouched by probes of a probe card such as the die pads NP1-NP5 shown in FIG. 1. For illustrative purposes, the following description describes exemplary operation of the proposed test scheme with reference to a die pad implemented by an input pad. However, this is not meant to be a limitation of the present invention. The proposed test scheme can be employed to I/O pad testing.

In a case where the probes PB1-PB5 touch the die pads DP1-DP5 for testing, the test circuit 200 may generate address signals of the die pads NP1-NP5 according to address signals of the die pads DP1-DP5 provided by the probe card. In other words, the test circuit 200 may refer to self-generated address signals to test the die pads NP1-NP5 which are untouched by the probes PB1-PB5. In addition, the address signals of the die pads DP1-DP5 and the address signals of the die pads NP1-NP5 may concurrently feed in the semiconductor die 102 (device under test (DUT)) for die testing. Since a person skilled in the art should understand operation of address compression testing and self-generating addresses, related description is omitted here for brevity.

In this embodiment, the test circuit 200 for testing a die pad 200 may include a precharge circuit 210 and a processing circuit 230, wherein the die pad 200 may be one of the die pads NP1-NP5. The precharge circuit 210 is coupled to the die pad 220, and is arranged for charging the die pad 220 to a precharge level VC, wherein when a voltage level VP of the die pad 220 reaches the precharge level VC, the precharge circuit 210 may stop charging the die pad 220. The processing circuit 230 is coupled to the die pad 220, and is arranged for detecting the voltage level VP of the die pad 220. As the die pad 220 may be regarded as a capacitor equivalently when the precharge 210 charges the die pad 220, the processing circuit 230 may monitor the voltage level VP to detect charge/discharge response of the equivalent capacitor, thereby determining a leakage current of the die pad 220. For example, the processing circuit 230 may be arranged for detecting a period of time required for the voltage level VP to change from the precharge level VC to a reference level VR when the precharge circuit 210 stops charging the die pad 220 and accordingly generating a detection result DR, wherein the processing circuit 230 may further determine the leakage current of the die pad 220 according to the detection result DR.

In some embodiments, when the detection result DR indicates that the period of time required for the voltage level VP to change from the precharge level VC to the reference level VR is longer than a predetermined time period, the processing circuit 230 may determine that the leakage current of the die pad 220 is less than a predetermined value (e.g. a leakage current specification value). When the detection result DR indicates that the period of time required for the voltage level VP to change from the precharge level VC to the reference level VR is shorter than the predetermined time period, the processing circuit 230 may determine that the leakage current of the die pad 220 is greater than the predetermined value. For example, in a case where the processing circuit 230 detects that the voltage level VP does not change from the precharge level VC to the reference VR within the predetermined time period, the detection result DR may indicate that the period of time required for the voltage level VP to change from the precharge level VC to the reference level VR is longer than the predetermined time period. Also, in a case where the processing circuit 230 detects that the voltage level VP has changed from the precharge level VC to the reference VR within the predetermined time period, the detection result DR may indicate that the period of time required for the voltage level VP to change from the precharge level VC to the reference level VR is shorter than the predetermined time period.

Additionally, when it is detected that the voltage level VP has changed from the precharge level VC to the reference VR within the predetermined time period, the die pad 220 is considered leaky or defective. The processing circuit 230 may determine that the leakage current of the die pad 220 is high. In contrast, when it is detected that the voltage level VP does not change from the precharge level VC to the reference VR within the predetermined time period, the processing circuit 230 may determine that the leakage current of the die pad 220 is low or acceptable.

In some embodiments, the processing circuit 230 may determine the predetermined time period according to the predetermined value, capacitance of the die pad 220 (equivalent capacitance), the precharge level VC and the reference level VR. By way of example but not limitation, the predetermined time period may be determined by the following expression:

$$C \times |VC-VR|/IP,$$

where C is the capacitance of the die pad 220, and IP is the predetermined value (e.g. a leakage current specification value).

In some other embodiments, the detection result DR may indicate the period of time required for the voltage level VP to change from the precharge level VC to the reference level VR. The processing circuit 230 may determine the leakage current according to the period of time indicated by the detection result DR, the capacitance of the die pad 220, the precharge level VC and the reference level VR. By way of example but not limitation, the leakage current may of the die pad 220 may be determined by the following expression:

$$C \times |VC-VR|/TL,$$

where C is the capacitance of the die pad 220, and TL is the period of time indicated by the detection result DR.

Figure 3:
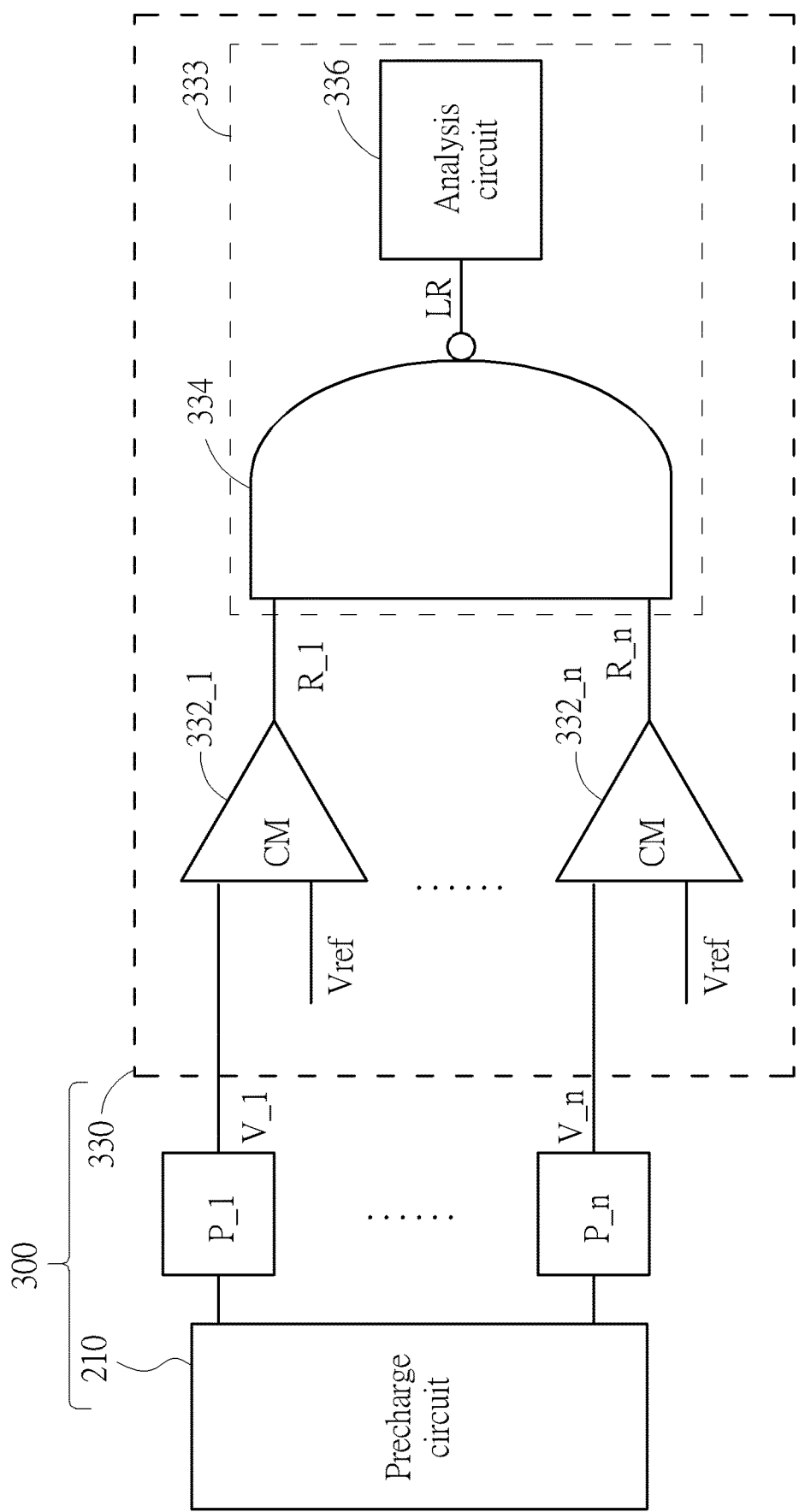
FIG. 3 is a diagram illustrating an exemplary test circuit of a semiconductor die according to an embodiment of the present invention.

In addition to detecting a leakage current of only one die pad, the proposed test scheme may detect a plurality of die pads in parallel to thereby identify KGD. Please refer to FIG. 3, which is a diagram illustrating an exemplary test circuit of a semiconductor die according to an embodiment of the present invention. The test circuit 300 may be arranged for testing one or more die pads P_1-P_$n$ ($n$ is a positive integer) the semiconductor die (not shown in FIG. 3), wherein each of the die pads P_1-P_$n$ may be an input pad or an I/O pad. The test circuit 300 may include, but is not limited to, the precharge circuit 210 shown in FIG. 2 and a processing circuit 330, wherein the processing circuit 230 shown in FIG. 2 may be implemented by the processing circuit 330. The processing circuit 330 may include, but is not limited to, one or more comparators 332_1-332_$n$ and a detection circuit 333. The comparators 332_1-332_$n$ are coupled to the die pads P_1-P_$n$ respectively, and may be arranged for detecting respective voltage levels V_1-V_$n$ of the die pads P_1-P_$n$ to generate one or more indication signals R_1-R_$n$. The detection circuit 333 is coupled to the comparators 332_1-332_$n$, and is arranged for determining if the semiconductor die is KGD according to the indication signals R_1-R_$n$.

The following description first describes exemplary leakage current detection of a single die pad in this embodiment. For example, regarding leakage current detection of the die pad P_1, the comparator 332_1 may compare the voltage level V_1 with the reference level Vref to generate the indication signal R_1, wherein when the voltage level V_1 is greater than the reference level Vref, the indication signal R_1 may have a first level (e.g. logic high); and when the voltage level V_1 is less than the reference level Vref, the indication signal R_1 may have a second level different from the first level (e.g. logic low). Hence, when the precharge circuit 210 precharges the die pad P_1 to the precharge level VC, the detection circuit 333 may detect a transition time period required for the indication signal R_1 to change from one of the first level and the second level to the other of the first level and the second level, so as to determine the period of time required for the voltage level V_1 to change from the precharge level VC to the reference level Vref.

Figure 4:
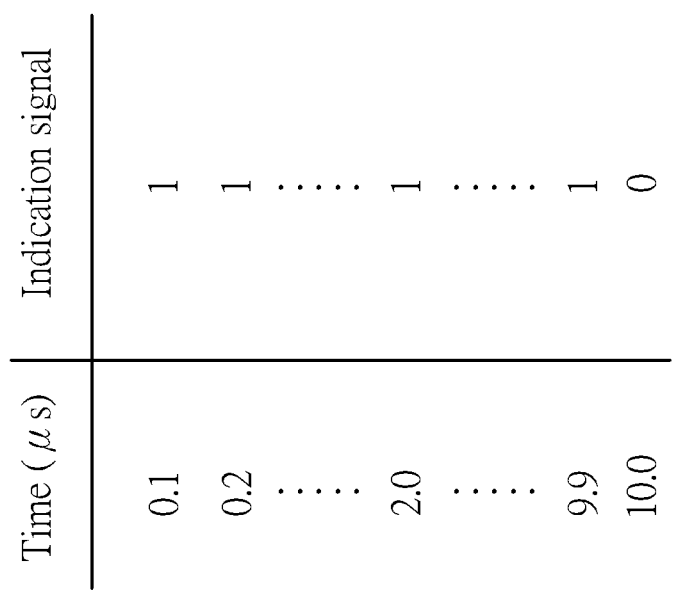
FIG. 4 illustrates an exemplary detection result associated with the die pad shown in FIG. 3.

By way of example but not limitation, the precharge circuit 210 charges the die pad P_1 to a high voltage level (the precharge level VC) such as a supply voltage of 2V. Next, the comparator 332_1 may compare the voltage level V_1 with the reference level Vref (e.g. half the high voltage level) to generate the indication signal R_1, wherein when the voltage level V_1 is greater than the reference level Vref, the indication signal R_1 may have a high signal level (logic high), and when the voltage level V_1 is less than the reference level Vref, the indication signal R_1 may have a low signal level (logic low). The detection circuit 333 may read the indication signal R_1 to determine the period of time required for the voltage level V_1 to change from the precharge level VC to the reference level Vref. In some embodiments, the detection circuit 333 (or the processing circuit 330) may read the indication signal R_1 once every predetermined time period (e.g. 0.1 μs) to detect whether the voltage level V_1 of the die pad 220 change to the reference level Vref. For example, the detection result associated with the die pad P_1 may be shown in FIG. 4, wherein the detection circuit 333 may determine that the period of time required for the voltage level V_1 to change from the precharge level VC to the reference level Vref is 10.0 µs. The detection circuit 333 (or the processing circuit 330) may accordingly calculate the leakage current of the die pad P_1 (having equivalent capacitance of 2 pF), which is equal to 2×|2−1|/10.0=0.2 (µA).

Please note that, in a case where the leakage current specification value is 1 µA, the transition time period required for the indication signal R_1 to change from the high signal level to the low signal (or the predetermined time period required for the voltage level V_1 to change from the precharge level VC to the reference level Vref) equals to 2×|2−1|/1=2 (µs) in this embodiment. Hence, the detection circuit 333 (or the processing circuit 330) may determine whether the leakage current of the die pad P_1 satisfies the leakage current specification value by detecting if the indication signal R_1 changes from the high signal level to the low signal level within 2 µs. When it is detected that the indication signal R_1 does not change to the low signal level, the detection circuit 333 may determine that the leakage current of the die pad P_1 satisfies the leakage current specification value.

In this embodiment, the test circuit 300 may utilize parallel testing and logic design to perform high-speed and high-accuracy KGD test. For example, the detection circuit 333 may include a NAND gate 334 and an analysis circuit 336, wherein the NAND gate 334 may receive the indication signals R_1-R_n to generate a logic output LR. The analysis circuit 336 may refer to the logic output LR to determine whether each of respective leakage currents of the die pads P_1-P_n satisfy the leakage current specification value. By way of example but not limitation, consider a case where the precharge level is 2V, the reference level Vref is 1V, capacitance of each die pad is 2 pF, and the leakage current specification value is 1 µA. Since the transition time period required for each indication signal to change from the high signal level to the low signal equals to 2 µs, and any one of the indication signals R_1-R_n has the low signal level will cause the logic output LR to have a high signal level (logic high), the analysis circuit 336 may detect if the logic output LR has the high signal level within 2 µs. When it is detected that the logic output LR to have the high signal level within 2 µs, the analysis circuit 336 may determine that at least one of the die pads P_1-P_n has a leakage current greater than the leakage current specification value.

The above is for illustrative purposes only, and is not meant to be a limitation of the present invention. For example, the processing circuit 330 (or the detection circuit 333) may detect if indication signal(s) and/or the logic output LR once every predetermined time period different from 0.1 µs. In another example, the processing circuit 330 (or the detection circuit 333) may continuously monitor indication signal(s) and/or the logic output LR.

Please note that, in addition to input pad testing, the proposed test scheme may be employed in I/O pad testing. For example, the precharge circuit 210 shown in FIG. 2/FIG. 3 may be implemented by an output driver, the die pad 220 and/or the die pads P_1-P_n shown in FIG. 3 may be I/O pads.

Figure 5:
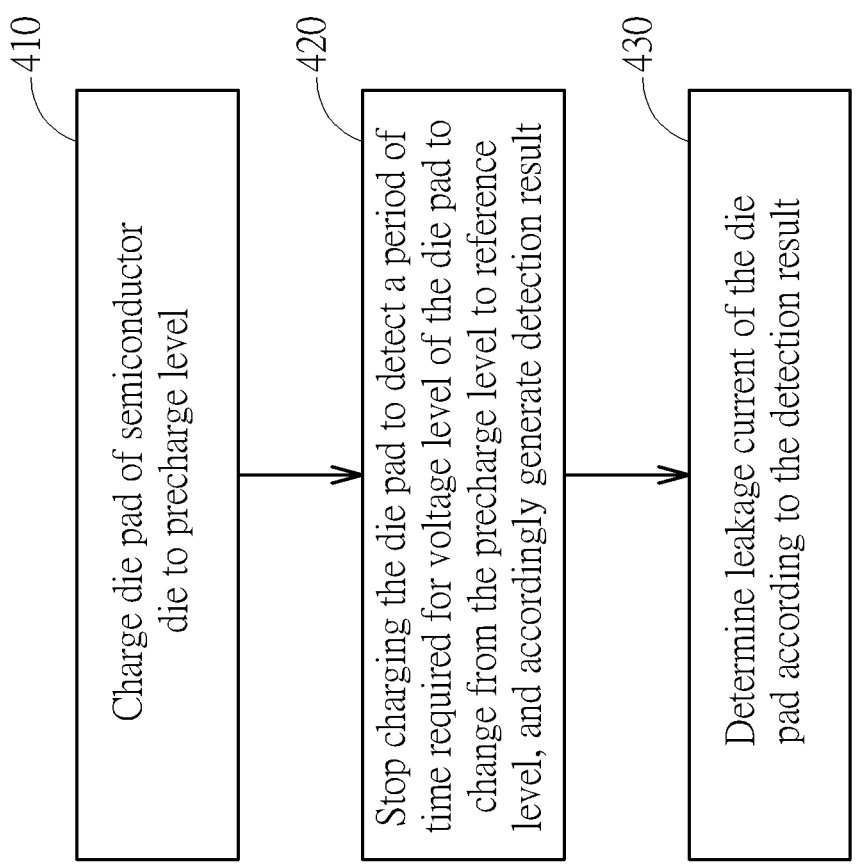
FIG. 5 is a flow chart of an exemplary method for testing a semiconductor die according to an embodiment of the present invention.

The proposed test scheme for a semiconductor die may be summarized in FIG. 5, which is a flow chart of an exemplary method for testing a semiconductor die according to an embodiment of the present invention. For illustrative purposes, the method shown in FIG. 5 is described with reference to the test circuit 200 shown in FIG. 2. This is not meant to be a limitation of the present invention. For example, the method shown in FIG. 5 may be employed in the test circuit 300 shown in FIG. 3. Additionally, the steps are not limited to be executed in the exact order shown in FIG. 5. For example, other intermediate steps can be added. The method shown in FIG. 5 may be summarized below.

Step 410: Charge a die pad of the semiconductor die to a precharge level. For example, the precharge circuit 210 may charge the die pad 220 to the precharge level VC.

Step 420: Stop charging the die pad to detect a period of time required for a voltage level of the die pad to change from the precharge level to a reference level, and accordingly generating a detection result. For example, the precharge circuit 210 may stop charging the die pad 220 when the voltage level VP reaches the precharge level VC, and simultaneously the processing circuit 230 may detect a period of time required for the voltage level VP to change from the precharge level VC to the reference level VR, and accordingly generating the detection result DR.

Step 430: Determine a leakage current of the die pad according to the detection result. For example, the processing circuit 230 may determine a leakage current of the die pad 220 according to the detection result DR.

In some embodiments, in step 430, when the detection result DR indicates that the period of time required for the voltage level VP to change from the precharge level VC to the reference level VR is longer than a predetermined time period (e.g. 2 µs), the processing circuit 230 may determine that the leakage current of the die pad 220 is less than a predetermined value (e.g. 1 µA). Further, when the detection result DR indicates that the period of time required for the voltage level VP to change from the precharge level VC to the reference level VR is shorter than the predetermined time period, the processing circuit 230 may determine that the leakage current of the die pad 220 is greater than the predetermined value.

In some other embodiments, in step 420, the detection result DR may indicates the period of time required for the voltage level VP to change from the precharge level VC to the reference level VR. The processing circuit 230 may determine the leakage current according to the period of time indicated by the detection result DR, capacitance of the die pad 220, the precharge level VC and the reference level VR (step 430). Since a person skilled in the art should understand the operation of each step shown in the FIG. 5 after reading the above paragraph directed to FIGS. 1-4, further description is omitted here for brevity.

To sum up, by precharging a die pad and detecting related signal level transition (e.g. transition of a digital logic state), the proposed test scheme for a semiconductor die may detect a leakage current of a die pad untouched by a probe, thus thoroughly detecting defects on the semiconductor die and perform KGD test with high accuracy and high speed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for testing a semiconductor die, comprising:
   charging a die pad of the semiconductor die to a precharge level;
   stopping charging the die pad to detect a period of time required for a voltage level of the die pad to change from the precharge level to a reference level, and accordingly generating a detection result; and
   determining a leakage current of the die pad according to the detection result.

2. The method of claim 1, wherein the step of determining the leakage current of the die pad according to the detection result comprises:

when the detection result indicates that the period of time required for the voltage level to change from the precharge level to the reference level is longer than a predetermined time period, determining that the leakage current of the die pad is less than a predetermined value; and when the detection result indicates that the period of time required for the voltage level to change from the precharge level to the reference level is shorter than the predetermined time period, determining that the leakage current of the die pad is greater than the predetermined value.

3. The method of claim 2, wherein the step of determining the leakage current of the die pad according to the detection result further comprises:

determining the predetermined time period according to the predetermined value, capacitance of the die pad, the precharge level and the reference level.

4. The method of claim 1, wherein the detection result indicates the period of time required for the voltage level to change from the precharge level to the reference level; and the step of determining the leakage current of the die pad according to the detection result comprises:

determining the leakage current according to the period of time indicated by the detection result, capacitance of the die pad, the precharge level and the reference level.

5. The method of claim 1, wherein the step of detecting the period of time required for the voltage level of the die pad to change from the precharge level to the reference level comprises:

comparing the voltage level with the reference level to generate an indication signal, wherein when the voltage level is greater than the reference level, the indication signal has a first level; and when the voltage level is less than the reference level, the indication signal has a second level different from the first level; and detecting a transition time period required for the indication signal to change from one of the first level and the second level to the other of the first level and the second level, so as to determine the period of time required for the voltage level to change from the precharge level to the reference level.

6. The method of claim 1, wherein the step of detecting the period of time required for the voltage level of the die pad to change from the precharge level to the reference level comprises:

detecting once every predetermined time period whether the voltage level of the die pad changes to the reference level.

7. The method of claim 1, wherein the die pad is an input pad or an input-output pad.

8. A test circuit of a semiconductor die, comprising:

a precharge circuit, coupled to a die pad of the semiconductor die, the precharge circuit arranged for charging the die pad to a precharge level;

a processing circuit, coupled to the die pad, the processing circuit arranged for detecting a period of time required for a voltage level of the die pad to change from the precharge level to a reference level when the precharge circuit stops charging the die pad, and accordingly generating a detection result, wherein the processing circuit further determines a leakage current of the die pad according to the detection result.

9. The test circuit of claim 8, wherein when the detection result indicates that the period of time required for the voltage level to change from the precharge level to the reference level is longer than a predetermined time period, the processing circuit determines that the leakage current of the die pad is less than a predetermined value; and when the detection result indicates that the period of time required for the voltage level to change from the precharge level to the reference level is shorter than the predetermined time period, the processing circuit determines that the leakage current of the die pad is greater than the predetermined value.

10. The test circuit of claim 9, wherein the processing circuit determines the predetermined time period according to the predetermined value, capacitance of the die pad, the precharge level and the reference level.

11. The test circuit of claim 8, wherein the detection result indicates the period of time required for the voltage level to change from the precharge level to the reference level; and the processing circuit determines the leakage current according to the period of time indicated by the detection result, capacitance of the die pad, the precharge level and the reference level.

12. The test circuit of claim 8, wherein the processing circuit comprises:

a comparator, coupled to the die pad, the comparator arranged for comparing the voltage level with the reference level to generate an indication signal, wherein when the voltage level is greater than the reference level, the indication signal has a first level; and when the voltage level is less than the reference level, the indication signal has a second level different from the first level; and a detection circuit, coupled to the comparator, the detection circuit arranged for detecting a transition time period required for the indication signal to change from one of the first level and the second level to the other of the first level and the second level, so as to determine the period of time required for the voltage level to change from the precharge level to the reference level.

13. The test circuit of claim 8, wherein the processing circuit detects once every predetermined time period whether the voltage level of the die pad changes to the reference level.

14. The test circuit of claim 8, wherein the die pad is an input pad or an input-output pad.

* * * * *

UNITED STATES PATENT AND TRADEMARK OFFICE
CERTIFICATE OF CORRECTION

PATENT NO. : 10,634,713 B2  
APPLICATION NO. : 15/903015  
DATED : April 28, 2020  
INVENTOR(S) : Der-Min Yuan Page 1 of 1

It is certified that error appears in the above-identified patent and that said Letters Patent is hereby corrected as shown below:

On the Title Page

Item (73), correct the address of the assignee from "Hsinchu County (TW)" to --Hsinchu City (TW)--.

Signed and Sealed this  
Thirtieth Day of June, 2020

Andrei Iancu  
*Director of the United States Patent and Trademark Office*